United States Patent

Iwasaki

[19]

[11] Patent Number: 6,011,447
[45] Date of Patent: Jan. 4, 2000

[54] POWER-ON RESET CIRCUIT APPLIED TO SEMICONDUCTOR INTEGRATED CIRCUIT DEVICE

[75] Inventor: Tadashi Iwasaki, Tokyo, Japan

[73] Assignee: NEC Corporation, Tokyo, Japan

[21] Appl. No.: 09/083,423

[22] Filed: May 22, 1998

[30] Foreign Application Priority Data

Jun. 2, 1997 [JP] Japan .................................. 9-143960

[51] Int. Cl.⁷ .................................................. H03K 17/22
[52] U.S. Cl. .......................... 331/185; 327/143; 327/198; 714/55
[58] Field of Search .................................. 327/143, 198; 331/185, 49, 186; 714/55

[56] References Cited

U.S. PATENT DOCUMENTS 5,739,708 4/1998 LeWalter ................................ 327/143

FOREIGN PATENT DOCUMENTS 3-178215 2/1991 Japan .
7-239348 12/1995 Japan .

*Primary Examiner*—Arnold Kinkead
*Attorney, Agent, or Firm*—McGinn & Gibb, P.C.

[57] ABSTRACT

A power-on reset circuit comprises an oscillation circuit, an oscillation end detection circuit, a voltage stabilizer for generating a predetermined voltage (VDD2) from a power-supply voltage (VDD), and a start-up circuit. The power-on reset circuit further comprises a latched circuit. While the power is rising, the latched circuit becomes of an initial state and outputs a signal for arranging the latched circuit to a power-on reset state. When a value of the VDD becomes more than the value of the VDD2, by which the VDD2 becomes of a stable state, the initial state of the latched circuit is canceled, while as the VDD becomes stable, the oscillation circuit starts the oscillation in order to arrange the latched circuit to a set state, thus outputting a signal for canceling the power-on reset state.

12 Claims, 10 Drawing Sheets

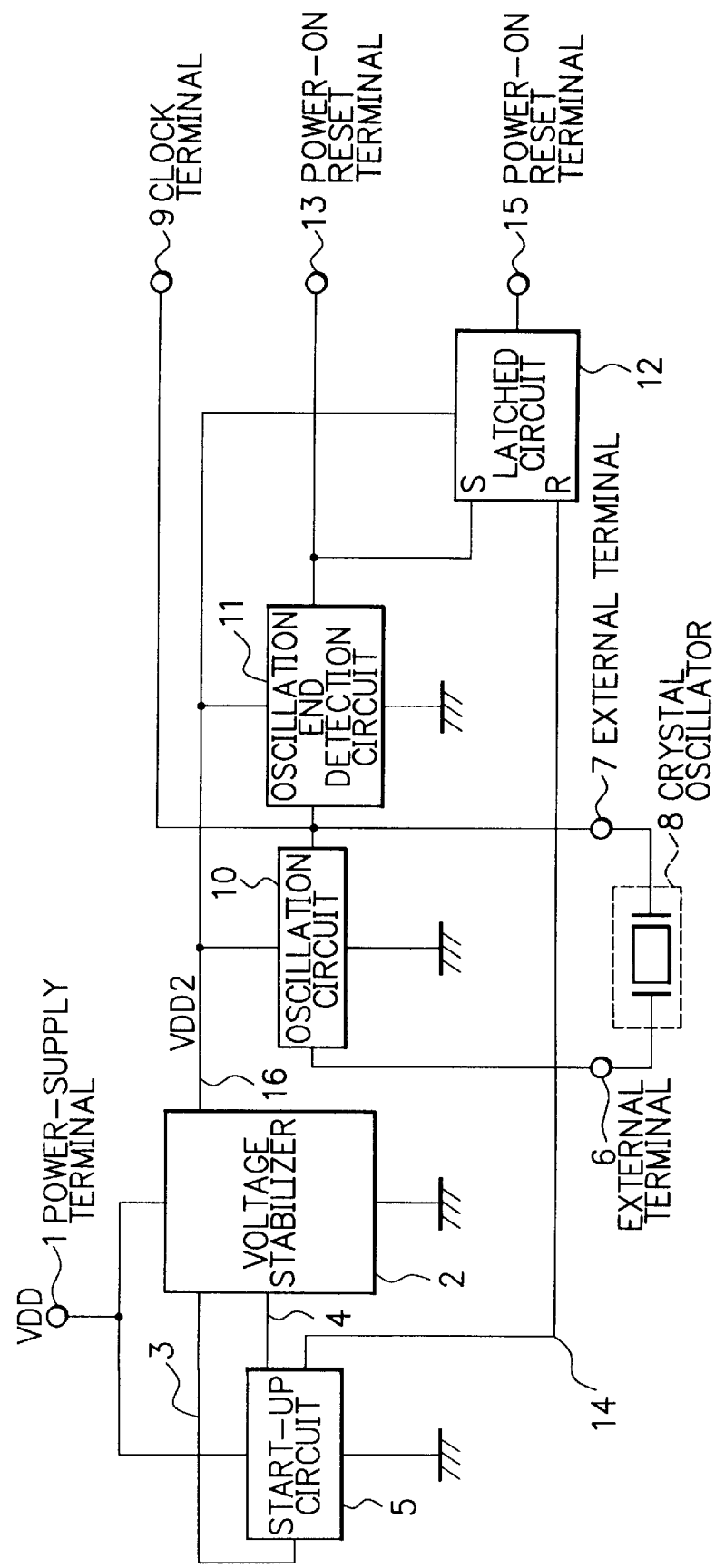
F I G. 7

POWER-ON RESET CIRCUIT APPLIED TO SEMICONDUCTOR INTEGRATED CIRCUIT DEVICE

BACKGROUND OF THE INVENTION

The present invention relates to a power-on reset circuit applied to a semiconductor integrated circuit device, particularly to the one that initializes an internal circuit such as a flip-flop circuit etc. at a time when the integrated circuit is power supplied.

DESCRIPTION OF THE RELATED ART

As to typical ways of constructing the power-on reset circuit, for instance, one option would be the way that maintains a reset state by monitoring the power-supply voltage by resistance dividing when the power supply voltage is lower than a predetermined voltage value. Another option would be the application of a time constant circuit which depends on the product of the resistance value and the capacitance value so as to delay a rest signal with respect to a power rise. The application of either one of such power-on reset circuit within the integrated circuit causes needs for elements with high-resistance and large capacitance, which causes an increase in a dissipation power and an area of the integrated circuit.

Consequently, most power-on reset circuits would have discrete parts such as resistance, capacitor etc. provided outside the integrated circuit. On the contrary, as to the integrated circuit including an oscillation circuit, it utilizes the time consumed in stabilizing the oscillation as a reset signal, so that the power-on reset circuit can be arranged within the integrated circuit, without having to prepare particular discrete parts as mentioned.

FIG. 1 is a block diagram showing a structure of a conventional power-on reset circuit having an oscillation circuit within an integrated circuit. This particular power-on reset circuit shown in the figure comprises a power-supply terminal 1, a voltage stabilizer 2, a start-up circuit 5, a crystal oscillator 8 which is connected to external terminals 6 and 7 of the integrated circuit, an oscillation circuit 10 and an oscillation end detection circuit 11.

The voltage stabilizer 2 is connected to the power-supply terminal 1 from which it receives a power-supply voltage VDD to generate a predetermined voltage VDD2 (VDD2<VDD) which is supplied to both the oscillation circuit 10 and the oscillation end detection circuit 11 in order to reduce the dissipation power. The start-up circuit 5 is to monitor a bias voltage 3 outputted from the voltage stabilizer 2, and send a current 4 to a bias circuit within the voltage stabilizer 2 until the voltage level stabilizes after the power supply, in order to stabilize the initial state of the voltage stabilizer 2. The oscillation circuit 10 is to generate a clock signal by the crystal oscillator 8 so as to output the generated clock signal to a clock terminal 9. The oscillation end detection circuit 11 is to detect whether the clock signal is properly generated, and outputs from a power-on reset terminal 13 an oscillation end detection signal.

FIG. 2 is a diagram illustrating a structure of the voltage stabilizer shown in FIG. 1. This voltage stabilizer comprises an operation amplifier 38, a reference voltage generator 41, and a bias circuit 44. The operation amplifier 38 of a voltage follower type takes VDD as a power source so as to output a predetermined voltage VDD2 from the output terminal 37. In the reference voltage generator 41, there are provided a P-channel transistor 39 having its source connected to the power-supply terminal 1, and two diodes 40 of which anode side is grounded. The P-channel transistor 39 and the diodes 40 are connected in series. The reference voltage generator 41 generates a reference voltage of the operation amplifier 38 using a band gap of a PN junction. The bias circuit 44 of a self-bias type complementary combines two current mirror circuits, one employing two P-channel transistors 42 and the other employing two N-channel transistors 43, in order to apply a stable bias voltage to a gate of the P-channel transistor 39 within the reference voltage generator 41. An output terminal 45 is to output a bias voltage 3 to the start-up circuit 5 shown in FIG. 1 where the bias voltage 3 is monitored. On the other hand, an input terminal 46 is to input the current 4 outputted from the start-up circuit 5 shown in FIG. 1.

FIG. 3 is a diagram showing a structure of the start-up circuit 5 illustrated in FIG. 1. This start-up circuit is comprising a current mirror circuit having two N-channel transistors 47, P-channel transistors 48, 50, 51, and an N-channel transistor 49. The P-channel transistor 48 monitors the bias voltage 3 inputted to an input terminal 52 from the output terminal 45 of the bias circuit 44 arranged within the voltage stabilizer 2, so as to feed-back the bias voltage 3 and switch the operation of the start-up circuit 5. The N-channel transistor 49 is to output a current to the bias circuit 44. The vertically arranged P-channel transistors 50 and 51 are to set a gate voltage of the N-channel transistor 49. The output terminal 53 is to output the current 4 outputted from the start-up circuit 5.

FIG. 4 is a diagram illustrating a structure of the oscillation circuit 10 shown in FIG. 1. This oscillation circuit comprises an inverter gate 54, a feed-back resistive element 55, capacitive elements 56, 57, and a negative resistive element 58. The inverter gate 54 has its input terminal connected to the external terminal 6, and its output terminal connected to the external terminal 7. It's drive ability is decided corresponding to a desired oscillation frequency. The feed-back resistive element 55 is connected in parallel to the inverter gate 54. The capacitive element 56 is connected to the external terminal 6. On the other hand, the capacitive element 57 is connected to the output terminal of the inverter gate 54. The negative resistive element 58 is connected in between the output terminal of the inverter gate 54 and the external output terminal 7, where it stabilizes the oscillation.

FIG. 5 is a diagram showing a structure of the oscillation end detection circuit 11 illustrated in FIG. 1. This oscillation end detection circuit comprises three N-channel transistors 59, capacitive elements 60, 64, a resistive element 61, an inverter gate 63, and a buffer gate 65 for output. The resistive element 61 is to discharge the electrical charges being stored in the capacitive element 60. The inverter gate 63 and the capacitive element 64 is to input a clock signal from the input terminal 62 for AC coupling. Thus a charge pump circuit is constructed, and when an oscillation of the oscillation circuit 10 stops, the electrical charges being stored in the capacitive element 60 is discharged through the resistive element 61, causing a low-level oscillation end detection signal to be outputted from the output terminal 66 to the power-on reset terminal 13.

Next, the operation of the conventional power-on reset circuit will be described with reference to FIGS. 1 to 6. FIG. 6 is a diagram showing the operation of the power-on reset circuit illustrated in FIG. 1.

As illustrated in FIG. 6, the capacitive element 60 within the oscillation end detection circuit 11 does not store charges before power is supplied to the integrated circuit, i.e. before t1. Thus, the oscillation end detection signal (reset signal) outputted from the oscillation end detection circuit 11 to the power-on reset terminal 13 is of a low level, which initializes (resets) the internal circuit of the integrated circuit.

When power is supplied to the integrated circuit at time t1, a voltage of the power-supply terminal 1 of the integrated circuit gradually rises, and at the same time, a voltage 16 outputted from the voltage stabilizer 2 also rises gradually. Then when the oscillation starts at the oscillation circuit 10 at time t2 when the voltage 16 outputted from the voltage stabilizer 2 is stabilized, the charge pump circuit of the oscillation end detection circuit 11 starts operating by which the capacitive element 60 starts storing electrical charges.

When the capacitive element 60 has enough charges stored therein to surpass an input logical threshold voltage of the buffer gate 65, the oscillation end detection signal (reset signal) outputted from the oscillation end detection circuit 11 becomes of a high-level at time t4. Then the oscillation end detection signal is outputted from the power-on reset terminal 13 as a reset cancel signal, which is to cancel the reset state (initial state) of the internal circuit of the integrated circuit.

At this point, the time t4, when the reset cancel signal is generated, can be sufficiently delayed from a time t3 when the power-supply voltage of the integrated circuit becomes a predetermined voltage VDD. Therefore, it is possible to substantiate a power-on reset without using any specially provided device.

As to the conventional power-on reset circuit, from time to time, it may have the oscillation become unstable due to the oscillation circuit being influenced by the outer environment such as a fluctuation of a power-supply voltage and electromagnetic noises. In such a case, the stored charges of the capacitive element 60 within the charge pump circuit will decrease, and become lower than the input logic threshold voltage of the buffer gate 65. When it is determined that the oscillation is being terminated, the oscillation end detection circuit is to become of a low level, causing the internal circuit to reset even when the power-supply voltage maintains the VDD level. This should be noted as a significant disadvantage.

Moreover, the computers in the recent years, have come to include a clock circuit so that the system management would be able to keep track of a date and time. This clock circuit has to get hold of an accurate time even when the computer is not being power supplied, and therefore, it utilizes a different power source from the computer itself due to a backup by a battery and such. As to the conventional power-on reset circuit, building the time circuit with an oscillation circuit and a memory circuit which divides the oscillation frequency to generate date and time data causes the memory circuit which stores the date and time data of the clock circuit to reset, once the oscillation of the computer power is determined as being terminated. This could cause a serious influence on the computer system.

Thus, as to ways of solving the problem of resetting the internal circuit and a clock circuit of the integrated circuit while they are not supposed to, there is a disclosure of Japanese Patent Laid-Open Publication No. 7-239348. As it is illustrated in FIGS. 1 and 2 of the disclosure, this is a method of latching the signal outputted from the power voltage detection circuit by a flip-flop. However, for the power voltage detection circuit is a circuit configured due to resistance dividing, and for it fixes the voltage by pulling up the initial state of the latched circuit by a depletion transistor, it should be expected that a dissipation power of the integrated circuit will increase. For instance, in arranging a resistance 300 kΩ between the power-supply voltage and the ground voltage, as much as 10 $\mu$A of current will be consumed constantly when the power-supply voltage is 3V. Therefore, this conventional power voltage detection circuit is not suitable for a less dissipation power circuit dependent on a backup by a battery.

Moreover, as to another means intended for resolving the above-indicated problems, there is a disclosure of Japanese Patent Laid-Open Publication No. 3-178215. As it is shown in FIG. 1 of this disclosure, this is a method of latching a signal from the power voltage detection circuit through an RC filter circuit constructed by the resistance R and the capacitance C by generating an intermediate potential. However, in order to generate a delay signal which is sufficient enough for the rise time of power, the resistance value R and the capacitance value C should become larger, which causes the area of the integrated circuit to become larger as well. For instance, in an attempt to generate 1 ms of delay with respect to a change of the power-supply voltage, the capacitance C must become 10 nF when the resistance R is 100 kΩ, and an approximate 4 mm$^2$ of an area is required in case when a TIOS capacitive device of a submicron processing is applied. This is suggesting that an area of the integrated circuit device, and thus the production cost increase.

SUMMARY OF THE INVENTION

It is therefore an object of the present invention to provide a power-on reset circuit which is capable of keeping a dissipation power of an integrated circuit as low as possible, and preventing the area of the integrated circuit from increasing.

According to a first aspect to the invention, there is provided a power-on reset circuit having an oscillation circuit, an oscillation end detection circuit for confirming whether an oscillation is carried out properly, a voltage stabilizer for generating a predetermined voltage (VDD2) from a power-supply voltage (VDD) and supplying the predetermined voltage (VDD2) to the oscillation circuit, a start-up circuit for initializing the voltage stabilizer, and a latched circuit for inputting an oscillation end detection signal from the oscillation end detection circuit and a switch signal from the start-up circuit so as to output a reset cancel signal for cancelling the initial state to the internal circuit of the integrated circuit. The power-on reset circuit outputs an oscillation end detection signal indicating that the oscillation at the oscillation circuit has stopped, a switch signal indicating that the start-up circuit is operating so as to set the latched circuit to an initial state, and a signal from the latched circuit to the integrated circuit in order to set a power-on reset state, at a time of power supply and right after that while the power is rising. The power-on reset circuit outputs a switch signal indicating that the start-up circuit has stopped so as to cancel the initial state of the latched circuit, while a value of the power-supply voltage (VDD) exceeds a value of the predetermined voltage (VDD2) thus leading the predetermined voltage (VDD2) outputted from the voltage stabilizer to become stable. The start-up circuit outputs an oscillation end detection signal indicating that an oscillation at the oscillation circuit has not stopped so as to arrange the latched circuit to become of a set state, and a signal from the latched circuit to the integrated circuit for cancelling the power-on reset state, at a time when the power-supply voltage (VDD) is stable and the oscillation circuit starts the oscillation.

According to a second aspect of the present invention, there is provided a power-on reset circuit according to the first aspect of the invention, wherein the latched circuit is an RS latched circuit in which a set terminal inputs the oscillation end detection signal thereto, and a reset terminal inputs the switch signal thereto.

According to a third aspect of the present invention, there is provided a power-on reset circuit according to the first aspect of the invention, wherein the latched circuit is a D latched circuit in which a clock terminal inputs the oscillation end detection signal thereto, and a reset terminal inputs the switch signal thereto.

Thus, with respect to the present invention having the above-mentioned aspects, once the latched circuit is being set, it never be reset unless the voltage stabilizer restarts. Therefore, even when the oscillation of the oscillation circuit stops, the set state of the latched circuit is maintained, and the circuit which regards the oscillation end detection signal as the reset signal will never be initialized except for such occasions where power is supplied.

The above and further objects and the novel feature of the invention will more fully appear from the following detailed description when the same is read in connection with the accompanying drawings. It is to be expressly understood, however, that the drawings are for illustration only and are not intended as a definition of the limits of the invention.

BRIEF DESCRIPTION OF THE DRAWINGS

FIG. 7 is a block diagram showing a power-on reset circuit of a first embodiment of the invention;

DESCRIPTION OF THE PREFERRED EMBODIMENTS

Figure 1:
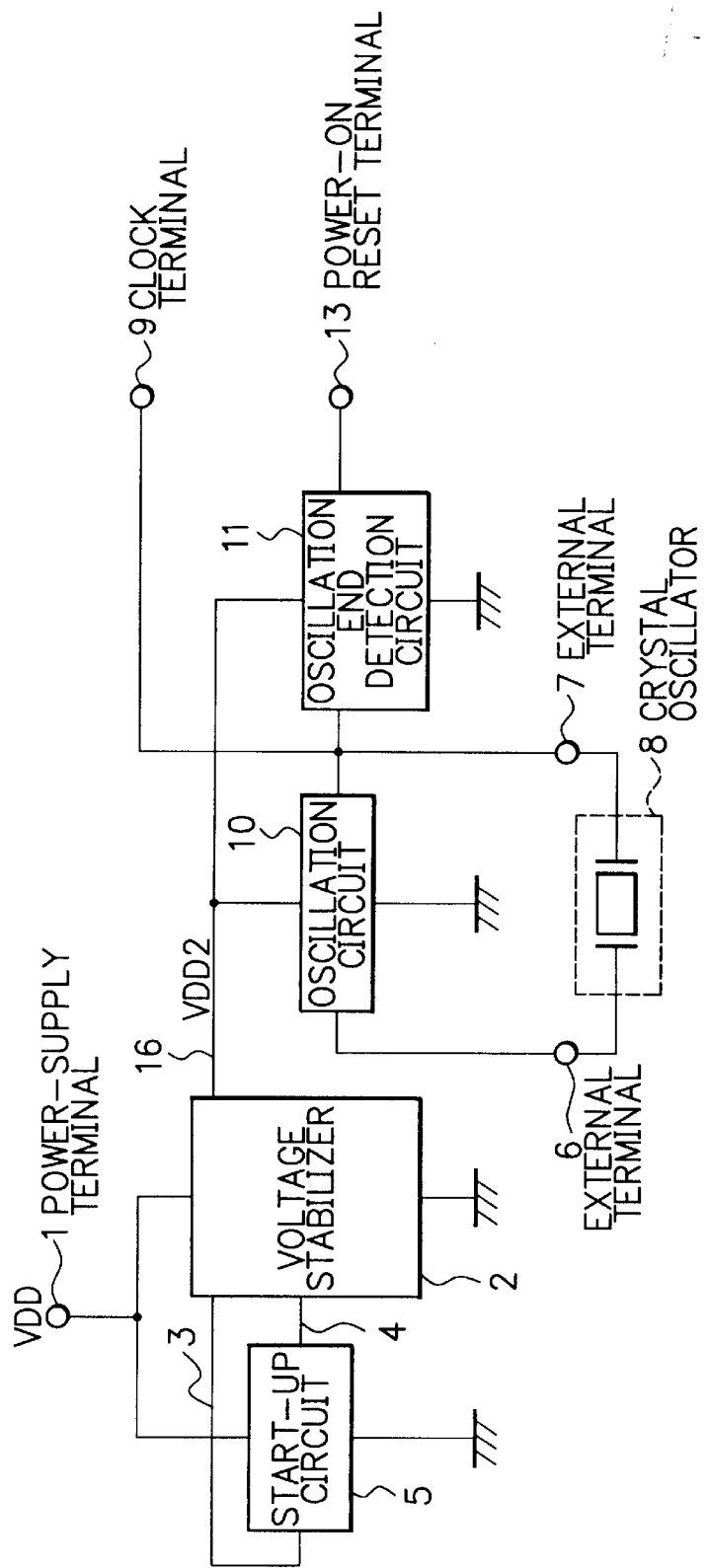
FIG. 1 is a block diagram showing a structure of a conventional power-on reset circuit.

Referring now to the drawings, a description of preferred embodiments of a power-on reset circuit of the present invention will be given in detail.

FIG. 7 is a block diagram illustrating a structure of a power-on reset circuit as a first embodiment of the present invention. This embodiment represents the most preferable state of the invention. The power-on reset circuit shown in FIG. 7 comprises a power-supply terminal 1, a voltage stabilizer 2, a start-up circuit 5, a crystal oscillator 8 connected to external terminals 6 and 7 of the integrated circuit, an oscillation circuit 10, an oscillation end detection circuit 11, and an RS latched circuit 12.

The voltage stabilizer 2 is connected to the power-supply terminal 1 from which it draws in a power-supply voltage VDD to generate a predetermined voltage VDD2 (VDD2<VDD) from the power-supply voltage VDD, so as to provide the voltage VDD2 to the oscillation circuit 10, the oscillation end detection circuit 11 and the RS latched circuit 12 in order to reduce the amount of power dissipation. The start-up circuit 5 monitors a bias voltage 3 outputted from the voltage stabilizer 2, and sends a current 4 to the bias circuit within the voltage stabilizer 2, until the voltage level is stabilized after the power supply, so as to arrange the initial state of the voltage stabilizer to stabilize. The oscillation circuit 10 is to generate a clock signal from the crystal oscillator 8 so as to output it to the clock terminal 9. The oscillation end detection circuit 11 is to detect whether the clock signal is generated properly. Then, an oscillation end detection signal outputted from the oscillation end detection circuit 11 is to be inputted to a power-on reset terminal 13 and to the RS latched circuit 12. The RS latched circuit 12 is to input the oscillation end detection signal which is outputted from the oscillation end detection circuit 11 to a set terminal S. At the same time, the RS latched circuit 12 is to input to a reset terminal R a switch signal 14 outputted from the start-up circuit 5, which is to initialize the voltage stabilizer 2. Then the RS latched circuit 12 outputs the output signal to a power-on reset terminal 15.

Figure 2:
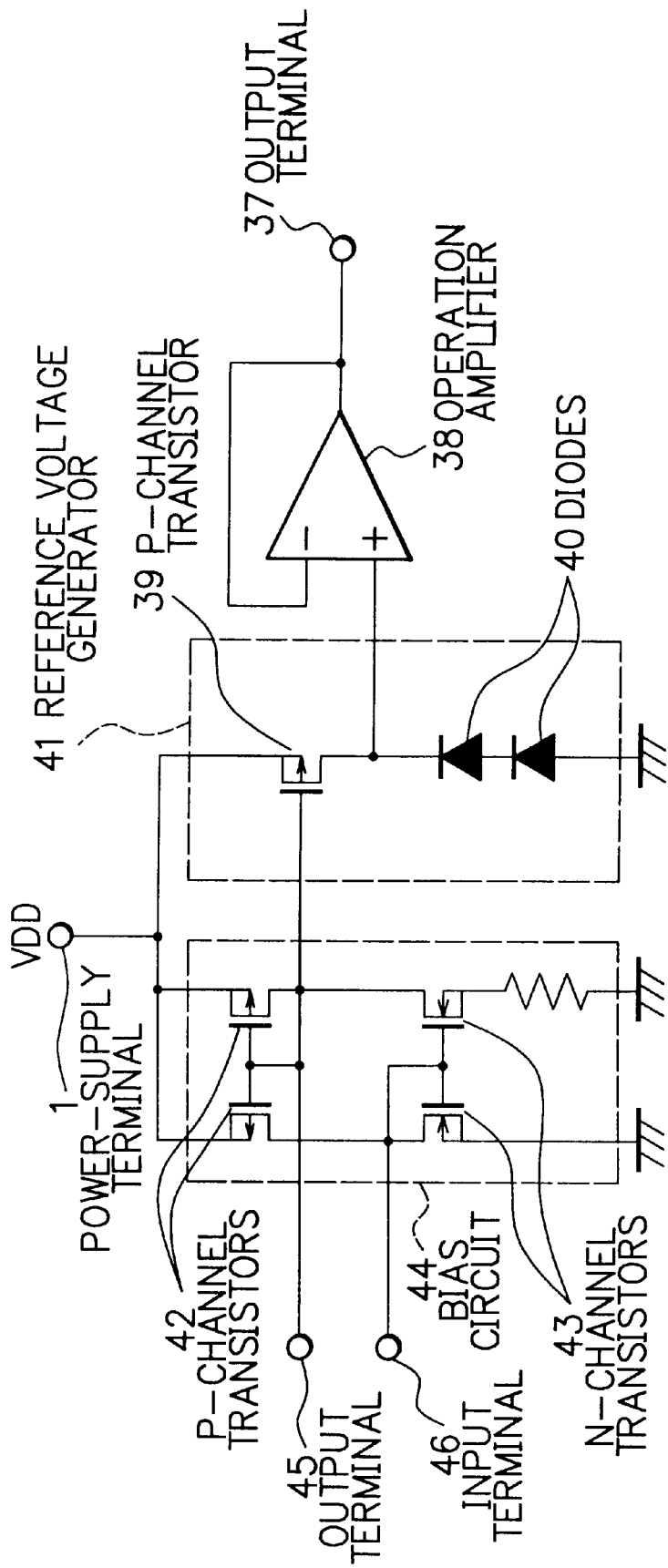
FIG. 2 is a diagram showing a voltage stabilizer shown in FIG. 1.
Figure 4:
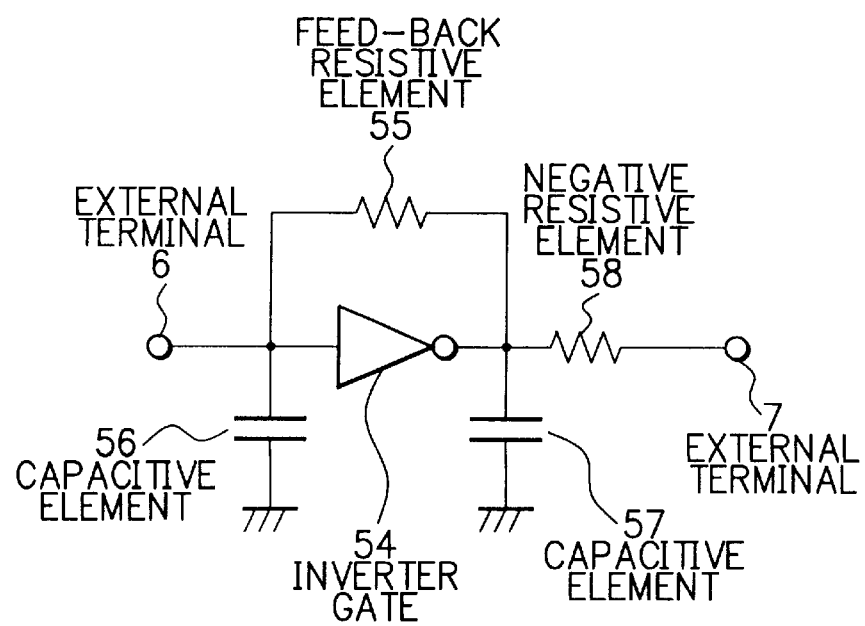
FIG. 4 is a diagram showing a structure of an oscillation circuit shown in FIG. 1.
Figure 5:
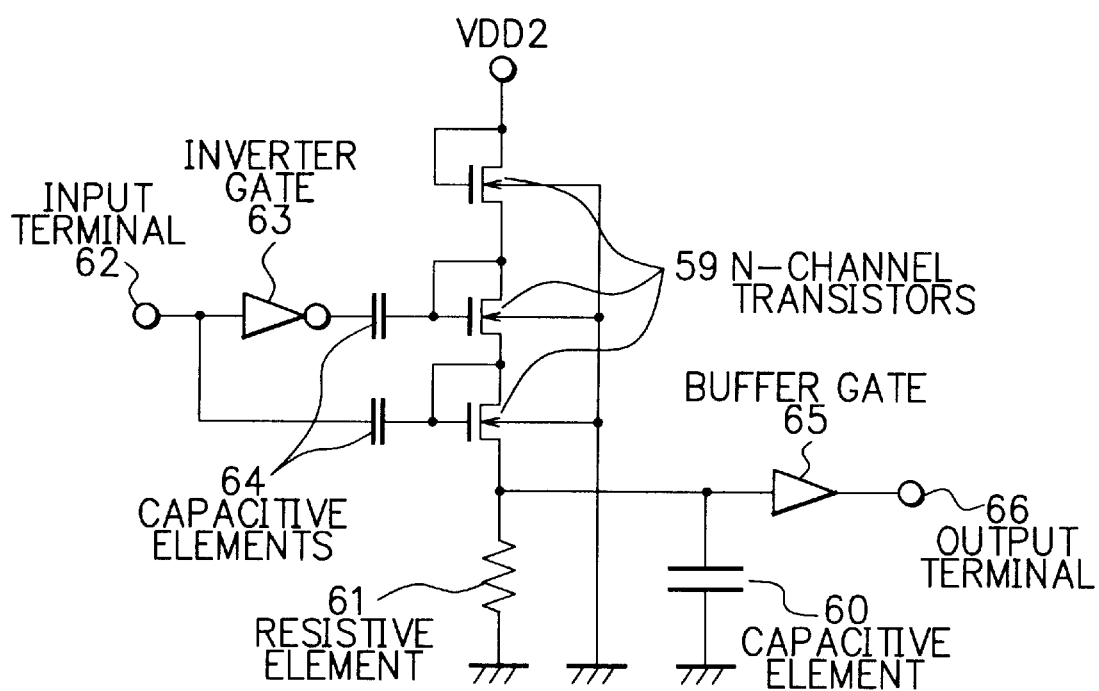
FIG. 5 is a diagram showing a structure of an oscillation end detection circuit shown in FIG. 1.

The voltage stabilizer 2, oscillation circuit 10 and oscillation end detection circuit 11 as shown in FIG. 7, are exactly the same as the circuits explained with reference to FIGS. 2, 4 and 5. Therefore, the explanations with respect to the mentioned constituents will be omitted.

Figure 3:
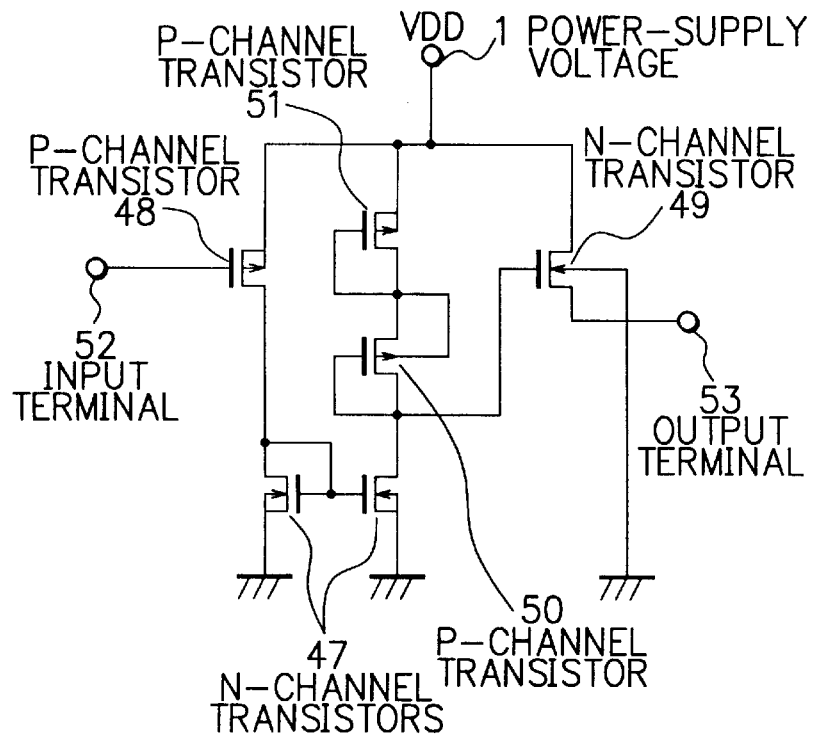
FIG. 3 is a diagram showing a structure of a start-up circuit shown in FIG. 1.
Figure 8:
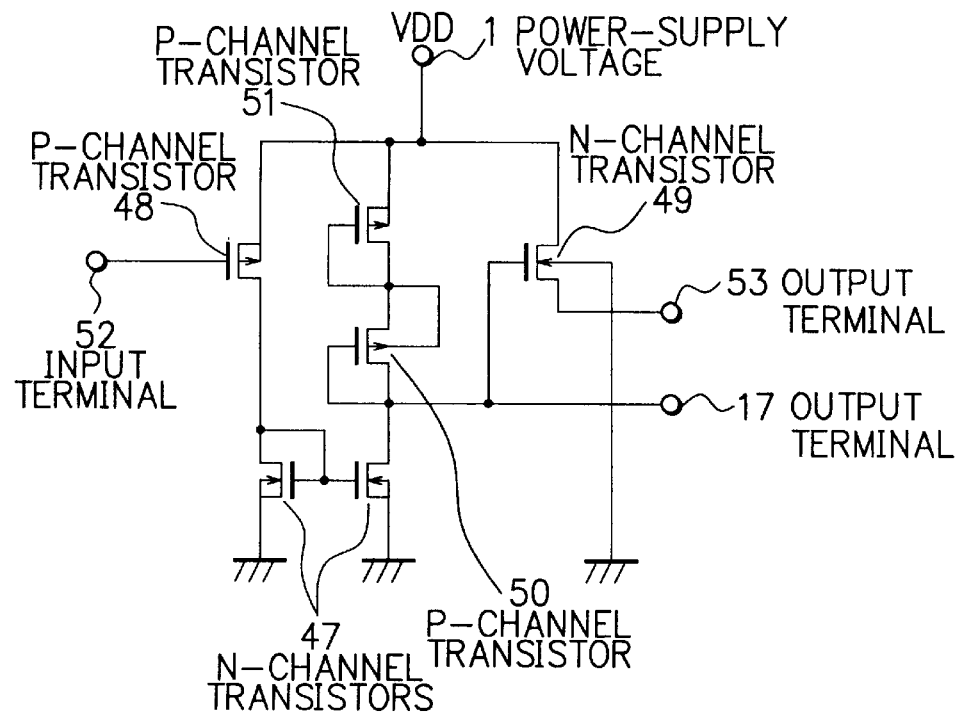
FIG. 8 is a diagram illustrating a structure of the start-up circuit shown in FIG. 7.

FIG. 8 is a diagram showing a structure of the start-up circuit 5 shown in FIG. 7. This start-up circuit is the same as the one explained as the prior art with reference to FIG. 3. The only difference between the start-up circuits shown in FIG. 8 and FIG. 3 is that the one in FIG. 8 is capable of taking out a switch signal 14 from an output terminal 17, the switch signal 14 being a signal for switching the N-channel transistor 49 for sending a current to the bias circuit 44 within the voltage stabilizer 2.

Figure 9:
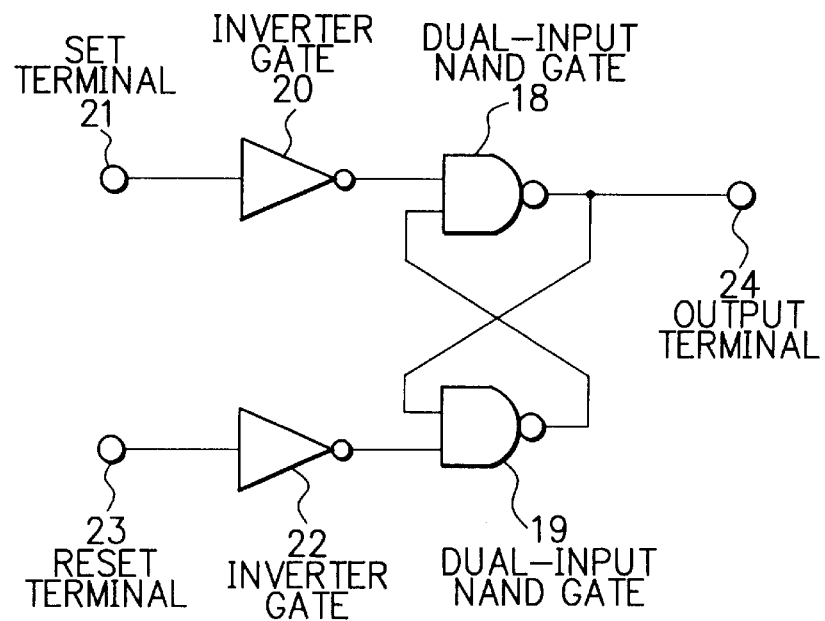
FIG. 9 is a diagram illustrating a structure of an RS latched circuit shown in FIG. 7.

FIG. 9 is a diagram showing a structure of the RS latched circuit 12 shown in FIG. 7. This latched circuit shown in this figure has dual-input NAND gates 18, 19 and inverter gates 20 and 22. The oscillation end detection signal inputted from a set terminal 21 is outputted to one of the input terminals of the dual-input NAND gate 18 through the inverter gate 20. On the other hand, the switch signal 14 inputted from a reset terminal 23 is outputted to one of the input terminals of the dual-input NAND gate 19 through the inverter gate 22. An output from the dual-input NAND gate 18 is inputted to the other input terminal of the dual-input NAND gate 19. Likewise, an output from the dual-input NAND gate 19 is inputted to the other input terminal of the dual-input NAND gate 18. Further, the output of the dual-input NAND gate 18 serves as an output terminal 24 of the RS latched circuit 12.

Figure 10:
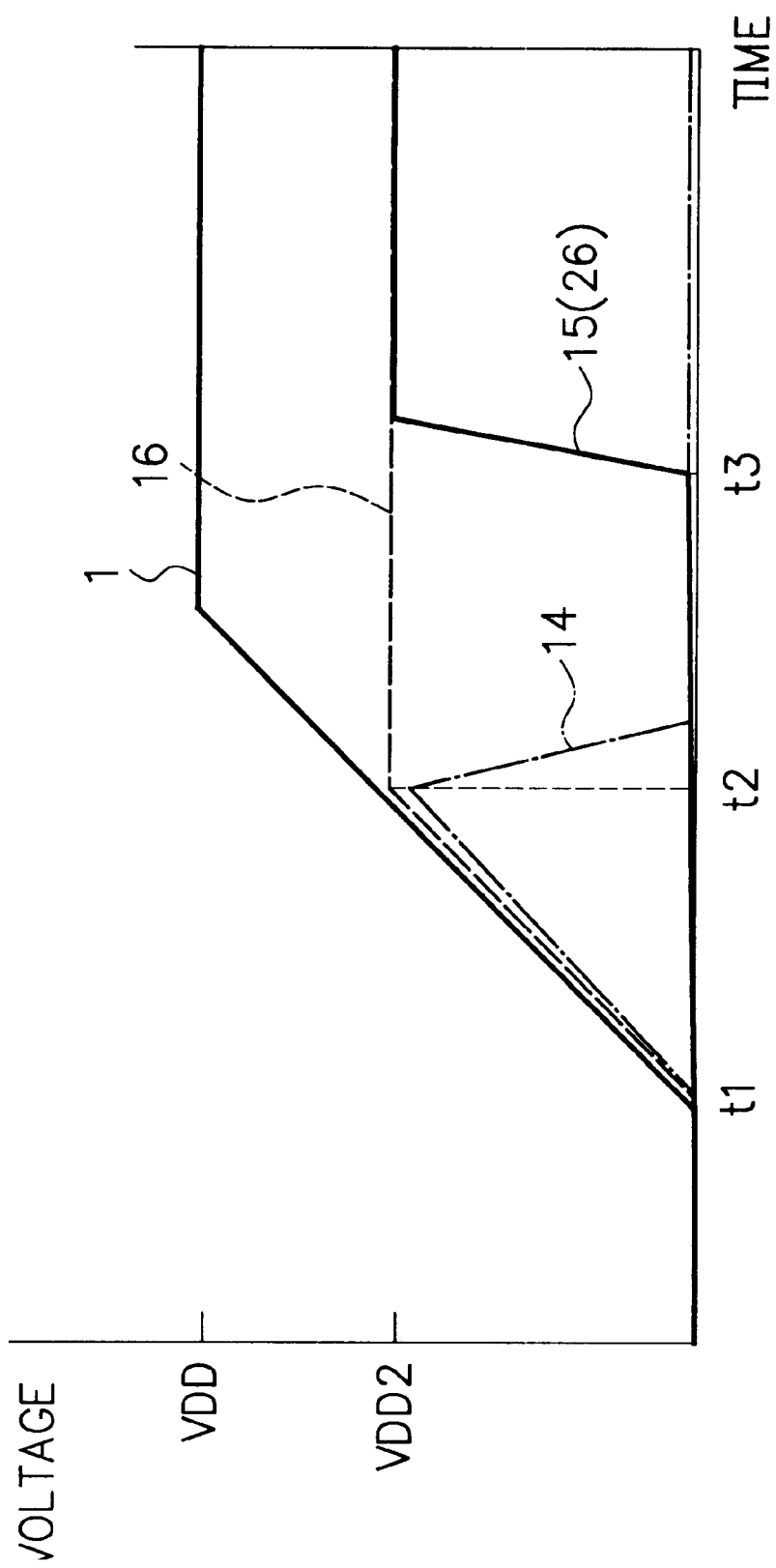
FIG. 10 is a diagram showing an operation of the power-on reset circuit illustrated in FIG. 7.

Next, an operation of the power-on reset circuit of the first embodiment of the invention will be described with reference to FIGS. 7 to 10. FIG. 10 is a diagram showing an operation of the power-on reset circuit shown in FIG. 7.

Figure 6:
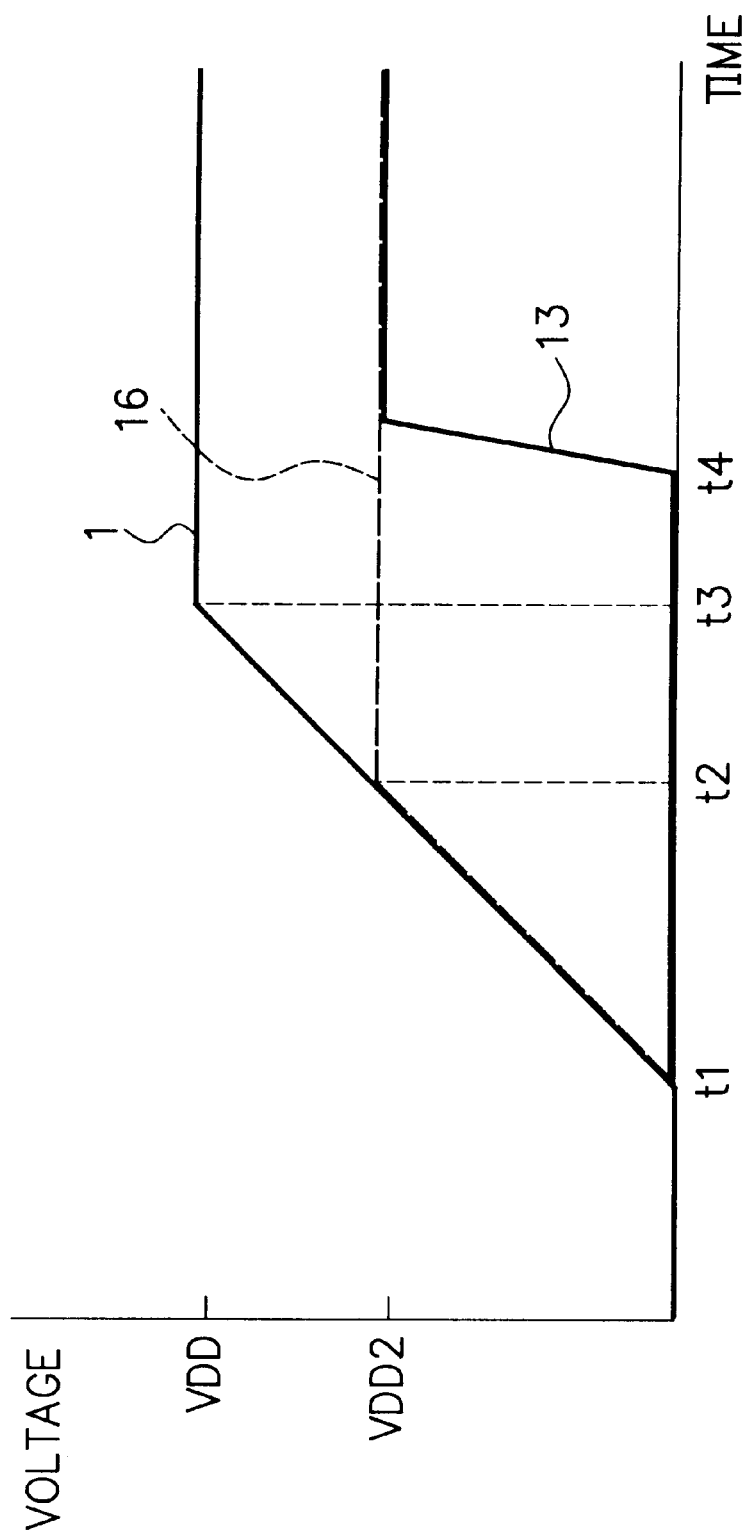
FIG. 6 is a diagram showing an operation of a power-on reset circuit shown in FIG. 1.

As shown in FIG. 10, before power is supplied to the integrated circuit, i.e. before time t1, electrical charges are not stored in the capacitive element 60 within the oscillation end detection circuit 11, as in the prior art example described with reference to FIG. 6. Thus, the oscillation end detection signal (reset signal) outputted to the power-on reset terminal 13 and the RS latched circuit 12 from the oscillation end detection circuit 11 is of a low level, initializing the internal circuit.

When power is supplied at time t1, a voltage of the power-supply terminal 1 of the integrated circuit will gradually rise. Likewise, a voltage 16 outputted from the voltage stabilizer 2 as well as the switch signal 14 outputted from the switch terminal 17 of the start-up circuit 5 will gradually rise.

While power is rising, i.e. time between t1 and t2, oscillation is not yet started at the oscillation circuit 10. Thus, a low-level oscillation end detection signal which shows the state of oscillation stop is inputted to the set terminal 21 of the RS latched circuit 12, and a high-level switch signal 14 which shows that the start-up circuit 5 is operating is inputted to the reset terminal 23. Consequently, the RS latched circuit 12 is initialized to a reset state. In this occasion, a reset signal of a low level is outputted from the output terminal 24 of the RS latched circuit 12 to the power-on reset terminal 15 from which it is outputted to the internal circuit.

At time t2, the voltage stabilizer 2 will be stabilized when a voltage from the power-supply terminal 1 of the integrated circuit exceeds the voltage VDD2 which the voltage stabilizer 2 provides. Then the start-up circuit 5 will stop and the switch signal 14 outputted from the start-up circuit 5 will become of a low level. Thus, a low level switch signal 14 is inputted to the RS latched circuit 12 at its reset terminal 23, causing the state of reset to cancel. Then, when the oscillation starts at the oscillation circuit 10 at time t2, a high level oscillation end detection signal, which indicates that the oscillation is proceeding at the oscillation circuit 10, is outputted from the oscillation end detection circuit 11. Thus, the RS latched circuit will become of a set state.

At time t3, a high level reset cancel signal is outputted from the output terminal 24 of the RS latched circuit 12 to the power-on reset terminal 15 from which it is outputted to the internal circuit.

Figure 11:
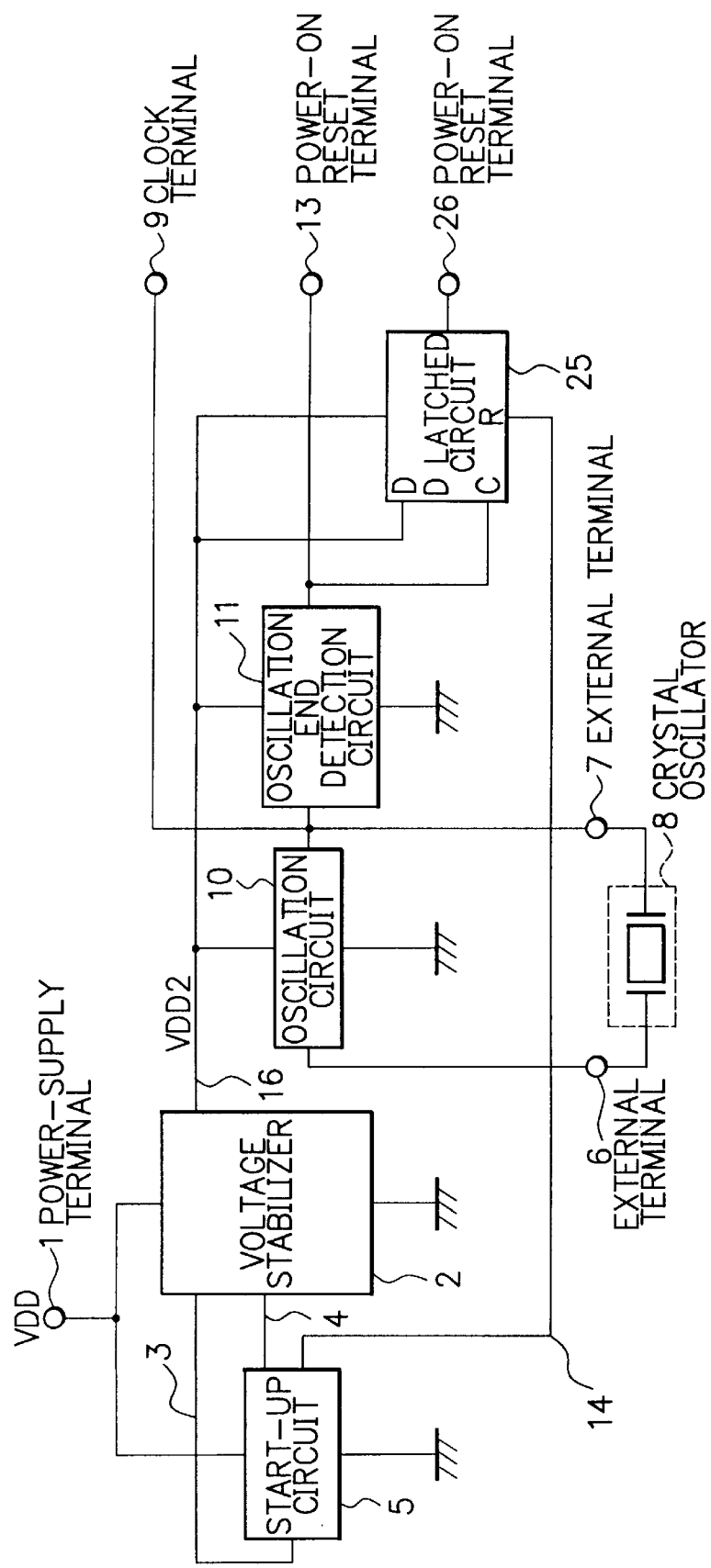
FIG. 11 is a block diagram showing a power-on reset circuit of a second embodiment of the invention.

FIG. 11 is a block diagram showing a structure of a power-on reset circuit of a second embodiment of the invention. This particular power-on reset circuit illustrated in FIG. 11 is practically the same as that of the first embodiment shown in FIG. 7, except that in the second embodiment, the RS latched circuit in the first embodiment is replaced by a D latched circuit. The power-on reset circuit comprises a power-supply terminal 1, a voltage stabilizer 2, a start-up circuit 5, a crystal oscillator 8 connected to external terminals 6 and 7 of the integrated circuit, an oscillation circuit 10, an oscillation end detection circuit 11, and a D latched circuit 25.

The voltage stabilizer 2 is connected to the power-supply terminal 1 from which it draws in a power-supply voltage VDD to generate a predetermined voltage VDD2 (VDD2<VDD) from the power-supply voltage VDD, so as to provide the voltage VDD2 to the oscillation circuit 10, the oscillation end detection circuit 11 and the D latched circuit 25 in order to reduce the amount of power dissipation. The start-up circuit 5 monitors a bias voltage 3 outputted from the voltage stabilizer 2, and sends a current 4 to the bias circuit within the voltage stabilizer 2, until the voltage level is stabilized after the power supply, so as to arrange the initial state of the voltage stabilizer to stabilize. The oscillation circuit 10 is to generate a clock signal from the crystal oscillator 8 so as to output it to the clock terminal 9. The oscillation end detection circuit 11 is to detect whether the clock signal is generated properly. Then, an oscillation end detection signal outputted from the oscillation end detection circuit 11 is to be inputted to a power-on reset terminal 13 and the D latched circuit 25. The D latched circuit 25 will have the voltage VDD2, which is outputted from the voltage stabilizer 2, inputted to its data terminal D. It will have the oscillation end detection signal, which is outputted from the oscillation end detection circuit 11, inputted to its clock terminal C. It will also have the switch signal 14, which is outputted from the switch terminal 17 of the start-up circuit 5 so as to initialize the voltage stabilizer 2, inputted to its reset terminal R, finally outputting an output signal from a power-on reset terminal 26.

The voltage stabilizer 2, start-up circuit 5, oscillation circuit 10 and the oscillation end detection circuit 11 are functioning in the exact same manner as in the circuits described as the prior art and as the first embodiment, with reference to FIGS. 2, 4, 5, and 8. Therefore, descriptions of those constituents are omitted.

Figure 12:
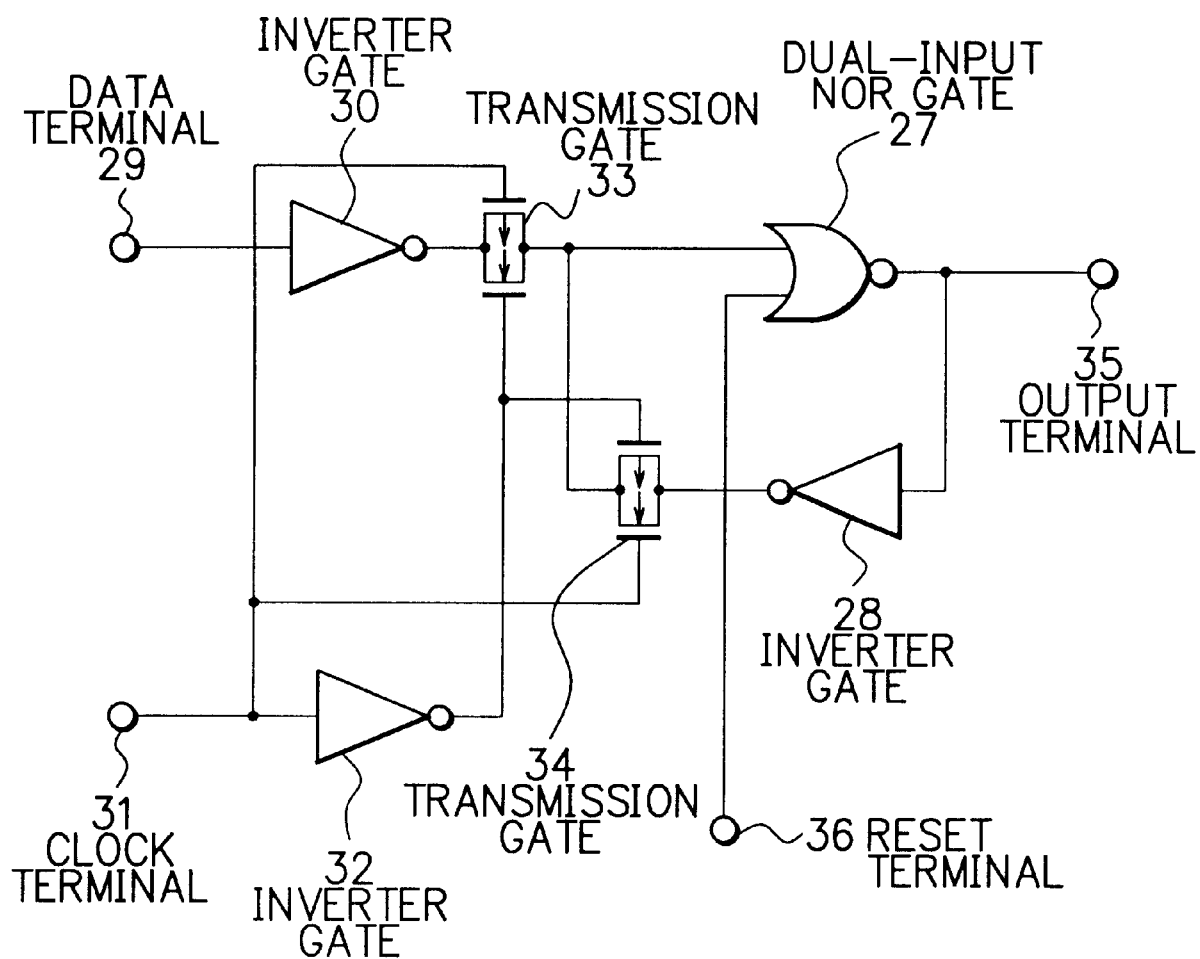
FIG. 12 is a diagram showing a structure of a D latched circuit shown in FIG. 11.

FIG. 12 is a diagram illustrating a structure of the D latched circuit shown in FIG. 11. The D latched circuit in FIG. 12 comprises a dual-input NOR gate 27, inverter gates 28, 30, 32 and transmission gates 33, 34. A data terminal 29 inputs the voltage VDD2 which is outputted from the voltage stabilizer 2. A clock terminal 31 inputs an oscillation end detection signal 14 which is outputted from the oscillation end detection circuit 11. A reset terminal 36 inputs a switch signal which is outputted from the start-up circuit 5. The dual-input NOR gate 27 and the inverter gate 28 are forming a loop circuit, in which one of the input terminals of the NOR gate 27 draws in the voltage VDD2 from the data terminal 29 via inverter gate 30 and transmission gate 33. The clock terminal 31 and the inverter gate 32 control the transmission gates 33 and 34 in order to latch data when the oscillation end detection signal which is inputted to the clock terminal 31 has a low level. An output signal from the dual-input NOR gate 27 is outputted from the output terminal 35 as latched data, and a switch signal 14 having been inputted from the reset terminal 36 is inputted to the other input terminal of the dual-input NOR gate 27.

The operation of the second embodiment of the invention is practically the same as the one described with reference to FIG. 10. Therefore, the description will be omitted.

One advantage of the invention is that even when the oscillation becomes unstable and even temporary ceased while rising after the integrated circuit is provided with power, the power-on reset circuit is capable of not resetting the internal circuit, proving that the power-on rest circuit is stable. This is due to the fact that the timing where the first oscillation starts is detected by the oscillation end detection signal and maintained at the latched circuit.

Another advantage of the invention is that the power-on reset circuit is capable of reducing the dissipation power of the integrated circuit without having to greatly augment the layout area, thus realizing a stable power-on reset circuit. This is due to the fact that there is no need for adding special circuits but only typical latched circuit, i.e. 12 transistors of an ordinary size. Consequently, initialization of the latched circuit is made possible without having to add a new element but only utilizing the already existing switch signal of the start-up circuit so that the initialization is made possible by only wiring changes.

In this way, when the integrated circuit is provided with power, the power-on reset circuit is capable of an unfailing power-on reset, owing to which the reset signal does not become active even when the oscillation turned unstable after the power supply. Therefore, it is possible to prevent the internal circuit of the integrated circuit from becoming initialized, and hold the dissipation power of the integrated circuit low, thus maintaining high integration without having to increase the area of the integrated circuit.

While preferred embodiments of the invention have been described using specific terms, such description is for illustrative purposes only, and it is to be understood that changes and variations may be made without departing from the spirit or the scope of the following claims.

What is claimed is:

1. A power-on reset circuit including:
    an oscillation circuit;
    an oscillation end detection circuit for confirming whether an oscillation is carried out properly;
    a voltage stabilizer for generating a predetermined voltage from a power-supply voltage and supplying the predetermined voltage to the oscillation circuit;
    a start-up circuit for initializing the voltage stabilizer; and
    a latch circuit for receiving an oscillation end detection signal from the oscillation end detection circuit and for receiving a switch signal from the start-up circuit, wherein said latch circuit outputs a reset cancel signal for canceling an initial state to an internal circuit of an integrated circuit,
    wherein at a time of power supply and a time subsequent to said power supply while the power is increasing, said oscillation end detection circuit outputs an oscillation end detection signal indicating that the oscillation at the oscillation circuit is inactive,
    wherein said switch signal indicates that the start-up circuit is operating so as to set said latch circuit to an initial state, and a signal from said latch circuit is input to said integrated circuit to set a power-on reset state,
    wherein during a time period when a value of the power-supply voltage exceeds a value of the predetermined voltage, by which the predetermined voltage outputted from the voltage stabilizer becomes stable, said start-up circuit outputs a switch signal indicating that the start-up circuit has stopped so as to cancel the initial state of the latch circuit, and
    wherein during a time period when the power-supply voltage is stable and the oscillation circuit starts the oscillation, said oscillation end detection circuit outputs an oscillation end detection signal indicating that an oscillation at the oscillation circuit is active such that the latch circuit has a set state, and said latch circuit outputs a signal to the integrated circuit for canceling the power-on reset state.

2. A power-on reset circuit according to claim 1, wherein the latch circuit comprises an RS latched circuit in which a set terminal inputs the oscillation end detection signal thereto, and a reset terminal inputs the switch signal thereto.

3. A power-on reset circuit according to claim 1, wherein the latch circuit comprises a D latched circuit in which a clock terminal inputs the oscillation end detection signal thereto, and a reset terminal inputs the switch signal thereto.

4. A power-on reset circuit comprising:
    an oscillation circuit;
    an oscillation end detection circuit, for confirming whether an oscillation is carried out properly, and for generating an oscillation end detection signal;
    a voltage stabilizer for generating a predetermined voltage from a power-supply voltage and supplying the predetermined voltage to said oscillation circuit;
    a start-up circuit for initializing said voltage stabilizer; and
    a latch circuit for inputting an oscillation end detection signal from said oscillation end detection circuit and a switch signal from said start-up circuit, so as to output a reset cancel signal for canceling an initial state to an internal circuit of an integrated circuit, wherein at a time of power supply and a time subsequent to said power supply while the power is increasing, said oscillation end detection circuit outputs an oscillation end detection signal indicating that the oscillation at the oscillation circuit has stopped,
    wherein said switch signal indicates that the start-up circuit is operating so as to set the latch circuit to an initial state, and
    the latch circuit outputs a power-on reset signal to said integrated circuit to set a power-on reset state.

5. A power-on reset circuit according to claim 4, wherein when a value of a power-supply voltage exceeds a value of a predetermined voltage, by which a predetermined voltage outputted from said voltage stabilizer becomes stable, said start-up circuit outputs a switch signal indicating that the start-up circuit has stopped so as to cancel the initial state of said latch circuit.

6. A power-on reset circuit according to claim 4, wherein when a power-supply voltage is stable and said oscillation circuit starts the oscillation, said oscillation end detection circuit outputs an oscillation end detection signal indicating that an oscillation at the oscillation circuit is active such that said latch circuit has a set state, and said latch circuit outputs a signal to the integrated circuit for canceling the power-on reset state.

7. A power-on reset circuit according to claim 4, wherein said latch circuit comprises an RS latch circuit in which a set terminal inputs said oscillation end detection signal thereto, and a reset terminal inputs the switch signal thereto.

8. A power-on reset circuit according to claim 4, wherein said latch circuit comprises a D latch circuit in which a clock terminal inputs said oscillation end detection signal thereto, and a reset terminal inputs the switch signal thereto.

9. A method of resetting a power-on condition in a circuit, comprising:
    confirming, by an oscillation end detection circuit, whether an oscillation by an oscillation circuit is being performed;
    generating, by a voltage stabilizer, a predetermined voltage from a power-supply voltage and supplying the predetermined voltage to the oscillation circuit;
    initializing, by a start-up circuit, the voltage stabilizer; and
    receiving, by a latch circuit, an oscillation end detection signal output from the oscillation end detection circuit and a switch signal issued from the start-up circuit, wherein said latch circuit outputs a reset cancel signal for canceling an initial state of a power-on reset condition to an internal circuit of an integrated circuit,
    wherein at a time of power supply and a time subsequent to said power supply while the power is increasing, outputting, by said oscillation end detection circuit, an oscillation end detection signal indicating that the oscillation at the oscillation circuit is inactive.

10. The method according to claim 9, wherein said switch signal indicates that the start-up circuit is operating so as to set said latch circuit to an initial state, and a signal from said latch circuit is input to said integrated circuit to set a power-on reset state.

11. The method according to claim 9, wherein during a time period when a value of the power-supply voltage exceeds a value of the predetermined voltage, by which the predetermined voltage outputted from the voltage stabilizer becomes stable, said start-up circuit outputs a switch signal indicating that the start-up circuit has stopped so as to cancel the initial state of the latch circuit.

12. The method according to claim 9, wherein during a time period when the power-supply voltage is stable and the oscillation circuit starts the oscillation, said oscillation end detection circuit outputs an oscillation end detection signal indicating that an oscillation at the oscillation circuit is active such that the latch circuit has a set state, and said latch circuit outputs a signal to the integrated circuit for canceling the power-on reset state.

* * * * *